United States Patent [19]

Wallace et al.

[11] Patent Number: 5,512,374

[45] Date of Patent: Apr. 30, 1996

[54] PFPE COATINGS FOR MICRO-MECHANICAL DEVICES

[75] Inventors: Robert M. Wallace, Dallas; Steven A. Henck, Plano, both of Tex.; Douglas A. Webb, Chandler, Ariz.

[73] Assignee: Texas Instruments Incorporated, Dallas, Tex.

[21] Appl. No.: 239,497

[22] Filed: May 9, 1994

[51] Int. Cl.$^6$ ................................................ B32B 27/00
[52] U.S. Cl. .................. 428/422; 252/58; 310/309; 427/240; 427/255.6; 427/435; 428/463
[58] Field of Search .............. 310/309; 427/240, 427/255.6, 435; 252/58; 428/422, 463

[56] References Cited

U.S. PATENT DOCUMENTS

| | | | |
|---|---|---|---|
| 4,845,268 | 7/1989 | Ohsaka et al. | 252/52 A |
| 4,943,750 | 7/1990 | Howe et al. | 310/309 |
| 5,248,432 | 9/1993 | Williams | 252/51.5 R |
| 5,252,881 | 10/1993 | Muller et al. | 310/309 |
| 5,331,454 | 7/1994 | Hornbeck | 359/224 |
| 5,403,665 | 4/1995 | Alley et al. | 427/309 X |

OTHER PUBLICATIONS

Levine and Zisman, "Physical Properties of Monolayers Adsorbed at the Solid–Air Interface. I. Friction and Wettability of Aliphatic Polar Compounds and Effect of Halogenation." J. Phys Chem. 61, (1957) vol. 61, pp. 1068–1077.

Levine and Zisman, "Physical Properties of Monolayers Adsorbed at the Solid–Air Interface. II. Mechanical Durability of Aliphatic Polar Compounds and Effect of Halogenation", J.Phys Chem. 61, (1957) vol. 61, pp. 1188–1196.

Alley, et al., "The Effect of Release–Etch Processing on Surface Microstructure Stiction" IEEE Solid State Sensor and Actuator Workshop (1992) pp. 202–207.

Primary Examiner—Michael Lusignan
Attorney, Agent, or Firm—Robert C. Klinger; James C. Kesterson; Richard L. Donaldson

[57] ABSTRACT

A micro-mechanical device (10) includes relatively movable elements (11, 17) which contact or engage and which thereafter stick or adhere. A perfluoropolyether (PFPE) film (31) is applied to the contacting or engaging portions of the elements (11,17) to ameliorate or eliminate such sticking or adhesion.

27 Claims, 1 Drawing Sheet

PFPE COATINGS FOR MICRO-MECHANICAL DEVICES

FIELD OF THE INVENTION

This invention relates to improved micro-mechanical devices and to a method for producing such improved devices. More particularly, the present invention relates to micro-mechanical devices having relatively selectively movable elements which may engage or contact, any tendency of the engaged or contacted elements to stick, adhere or otherwise resist separation being ameliorated or eliminated in the improved device through the use of the method according to this invention.

BACKGROUND OF THE INVENTION

A recent development in the field of electro-mechanics has been the miniaturization of various electro-mechanical devices, called "micro-mechanical" devices. These micro-mechanical devices are typically manufactured using MOS and other integrated circuit techniques. Micro-mechanical devices include tiny motors, microgears, and a type of spatial light modulator CSLM") comprised of items often referred to as "DMD,s" which stands for "deformable mirror device" or, more recently, "digital micromirror device."

A DMD SLM includes one or more electrically conductive, selectively movable reflectors or mirrors. Light incident on a DMD is selectively reflected or not reflected to a reception site, depending on the position of the mirrors.

Each mirror is carried by one or more deformable beams. The beams may be cantilever, torsion or flexure (cantilever+torsion) beams. The beams are supported by posts or spacers so that each mirror is maintained over and spaced from a substrate. The distance between each mirror and the substrate permits the mirror to move relatively to the substrate—toward and/or away therefrom—out of a normal position in which no energy is stored in its beams. Movement of a mirror deforms and stores energy in its beams which tends to return the mirror to its normal position.

Each mirror is selectively moved by control circuitry monolithically formed in and on the substrate. The circuitry may include one or more selectively energizable control electrodes and one or more landing electrodes on the substrate. Application of appropriate voltages to selected control electrodes and to selected mirrors (via their beams) produces an electrostatic field therebetween which effects movement of the selected mirrors away from or, as is more typical, toward the substrate. Mirror movement may be analog—proportional to the strength of the electrostatic field'bistable or tristable. In the latter two events, the electric field is simply rendered sufficiently strong to move the mirrors until they abut or contact a "stop."

Analysis of non-analog operation of DMD's indicates that neither the substrate nor the control electrode is a desirable stop for its associated mirror. Engagement between the mirror and either of these items typically leads to the mirror becoming "welded" thereto or destruction of the mirror. As a consequence, the landing electrodes serve as stops, that is, they are contacted or engaged by the edges of the mirrors. The landing electrodes are rendered electrically neutral relative to the mirrors, that is, they and the mirrors are at the same potential. Accordingly, engagement of the landing electrodes by the mirrors avoids welding or destruction of the mirrors.

However, reliability has been difficult to achieve with micro-mechanical devices. A common reliability problem is adhesion or sticking, which occurs when relatively movable elements contact each other. If these elements stick or adhere together, the device may cease to operate properly. A related problem is that repeated contact between elements or micromechanical devices can cause their surfaces to wear.

Sticking or adhesion in DMD's has been theorized to be caused, inter alia, by intermetallic bonding between mirrors and their landing electrodes and/or by the high surface energy of the contacting members due to the material thereof or to contaminants sorbed by or otherwise resident on their surfaces. Whatever the cause of sticking or adhesion, which such occurs, the energy stored in a mirror's beam(s) following its movement out of the normal position may be insufficient to return the mirror to its normal position.

To avoid the foregoing problems associated with contacting or engaging elements, many micro-mechanical devices are designed so as not to include elements that come into contact with each other. However, such design restrictions may unduly limit the versatility of micro-mechanical devices and, in any event, would, if applied to non-analog DMD's, absolutely prevent the operation thereof.

Commonly assigned U.S. patent application, Ser. No. 08/216,194, filed Mar. 21, 1994, now U.S. Pat. No. 5,447,600, patented Sep. 5, 1995, describes one approach to avoiding sticking or adhesion of contacting elements of micro-mechanical devices, including the mirrors and landing electrodes of DMD's. Specifically, that application describes the application, during DMD fabrication, of a solid polymeric layer to that portion of one of the contacting elements (e.g., the landing electrode) which contacts the other element (e.g., the mirror). Preferred polymers include fluoropolymers, such as Teflon-AF. Other approaches are set forth in commonly assigned U.S. application Ser. No. 08/220,429, filed Mar. 30, 1994 [TI-18470].

SUMMARY OF THE INVENTION

One aspect of the invention is an improved micro-mechanical device. The device has a first element selectively movable relative to a second element. Portions of the elements contact in one position of the first element. The device may be a DMD SLM and the elements may respectively be a movable mirror or other mass, carried by one or more deformable beams, and a landing electrode. The elements may be produced by MOS or other integrated circuit techniques and may comprise aluminum bearing an aluminum oxide skin.

In the improved device, at least one, and preferably both, of the contacting portions of the elements have deposited thereon a film of perfluoropolyether (PFPE). The PFPE film is effective to ameliorate or prevent sticking or adhesion of the elements.

The PFPE may be Z-type, Y-type, Krytox or Demnum and the film is preferably about 5 angstroms to about 100 angstroms thick. The PFPE may be acetal-deficient, acetal-free or acetal-rich, and may contain chemical functional groups, including carboxylic, hydroxyl, ethel, or phenolic, among others.

The PFPE is selected so as to provide minimal interfacial degradation with the surfaces that it covers, as well as optimal chemical and thermal stability. The PFPE film has a thickness that is sufficiently thin to not interfere with functionality of the device, yet at the same time is thick enough to take advantage of the migration-effected, "self-healing" properties of the liquid, oil-like PFPE materials.

A technical advantage of the invention is that the PFPE film may be thicker than lubricative coatings that have been previously used to counteract the tendency of the elements to stick or adhere. The PFPE material is thermally stable, and can be selected to be chemically stable with surfaces of particular materials and processing history.

DETAILED DESCRIPTION OF THE INVENTION

For purposes of example, the following description is in terms of a particular type of improved micro-mechanical device, namely an improved DMD 10. As previously described, a DMD includes one or more—typically an array of many thousands—selectively movable, tiny mirrors 11 which selectively reflect (or not) incident light to an image plane or other site. An array of DMD's 10 may be used to selectively form images. The present invention obviates the sticking or adhesion of the mirrors 11 to landing electrodes 17 which are contacted by the mirrors 11. Images formed by the DMD 10 can be used in display systems and for non-impact printing applications.

Figure 1:
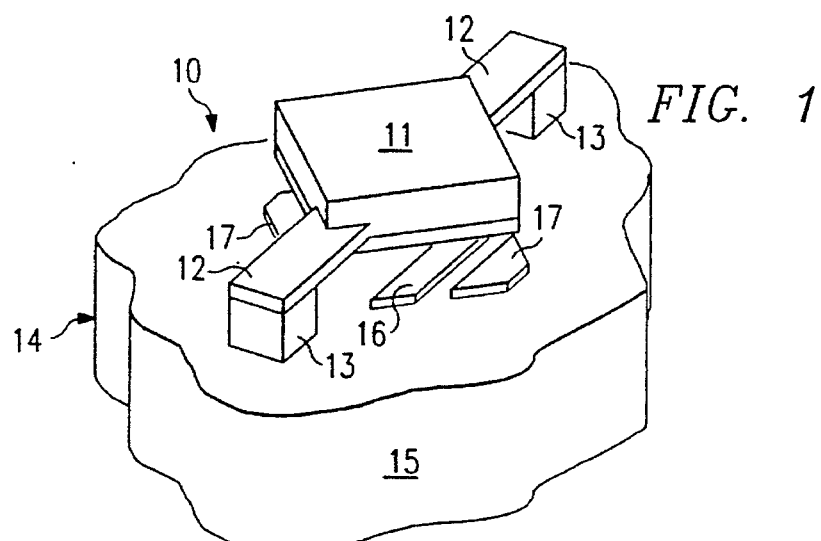
FIG. 1 illustrates a micro-mechanical device or DMD the mirror of which is undetected.
Figure 2:
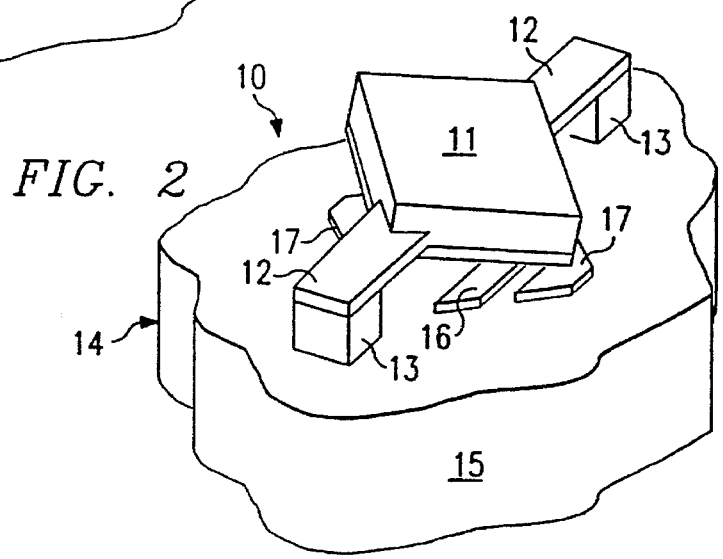
FIG. 2 illustrates the DMD of FIG. 1 with the mirror being in a deflected position and contacting a landing electrode to which the mirror may undesirably stick or adhere.

Other non-image-forming applications of DMD's 10 include optical steering and switching and accelerometers. In some of these applications, the mirror 11 need not function as such and, accordingly, need not be reflective. Also, in some applications, the DMD 10 is not operated in a digital mode. In general, then, "DMD" as used herein is intended to encompass any type of micro-mechanical device having selectively movable elements that contact or engage, and may stick or adhere to, another element. Similarly "mirror" means any mass, reflective or not, which moves incidental to the operation of the micro-mechanical device. FIGS. 1 and 2 illustrate a single DMD 10. In FIG. 1, the mirror 11 is in its normal or undetected position, in which the mirror 11 may, as shown, be generally parallel to the surface of a substrate 15. In FIG. 2, the mirror 11 has been selectively moved or deflected in a binary manner to a position whereat the edge of the mirror 11 engages and contacts the landing electrode 17 acting as a stop. As noted above, a typical DMD SLM may have an array of hundreds or thousands of such mirrors 11 each of which reflects or does not reflect incident light to a selected site depending on its undeflected or undeflected position. The DMD 10 of FIGS. 1 and 2 is a torsion beam DMD, because its mirror 11 is supported by torsion beams 12. Other types of DMD's can be fabricated, such as cantilever types and flexure types, and including those fabricated with so-called "hidden hinges." Various types of DMD's 10 are described in commonly assigned U.S. Pat. Nos. 4,662,746, 4,956,610, 5,061,049 and 5,083,857, and application Ser. No. 08/097,824, filed Jul. 27, 1993 all incorporated hereinto.

In operation for display and other applications, radiant energy, such as visible light, from a source thereof (not shown) illuminates the DMD 10. Appropriate lens systems (not shown) may be used to confine the radiant energy to within the border of the array of DMD's to direct the radiant energy onto the mirrors 11. Each movable mirror 11 is supported by torsion beams 12 attached to support posts 13. The mirrors 11 are positioned over a control or address/memory circuit 14, which is fabricated on a silicon substrate 15. The control circuits 14 selectively apply selected voltages to control electrodes 16 formed on the substrate 15. The support posts 13 are formed on and extend away from the substrate 15.

Electrostatic forces between the mirrors 11 and their control electrodes 16 are produced by selective application of selected voltages to the control electrodes 16 and the mirrors 11. These voltages may be based on the data in memory cells of address/memory circuit 14. In a particular type of DMD, operation is achieved by rotating the mirrors 11 about axes coincident with the torsion beams 12 out of the normal position (in which the mirror 11 is "on") about 10°. In the rotated position, the mirror 11 is "off." The pattern of "on" and "off" mirrors 11 in the array modulates the incident light. Light reflected from the "on" mirrors 11 is directed to a selected site via various display optics (not shown). Light from the "off" mirrors 11 is directed away from the selected site.

If the control circuit 14 includes two control electrodes 16, the mirror 11 may be capable of occupying any one of three positions. Specifically, the rotation of the mirror 11 may be tristable, that is, fully rotated and "stopped" against a landing electrode 17 10° clockwise or counterclockwise or in the normal position.

Each mirror 11 and its associated control electrode 16 form a capacitor, with each element serving as a capacitor plate. When appropriate voltages are applied to the control electrodes 16 and to the mirror 11, the electrostatic force (attractive or repulsive) produced therebetween causes the mirror 11 to move toward one or the other of the landing electrodes 17 until an edge of the mirror 11 abuts and contacts the appropriate landing electrode 17.

Once the electrostatic force between the control electrode 16 and the mirror 11 is eliminated, the energy stored in the beams 12 biases the mirror 11 back toward the normal position. Appropriate voltages may be applied to the various elements 11, 16, 17 to aid in returning the mirror 11 to its normal position.

As alluded to above, if the mirror 11 and the landing electrode 17 stick or adhere, the mirror 11 may fail to return to its normal position for that reason. Eliminating or ameliorating such sticking or adhesion and/or the effects thereof is one goal of the present invention.

In accordance with the present invention a film of oil-like perfluoropolyether, also known as Fomblin or PFPE, is deposited on those portions of the mirrors 11 and their control electrodes 17 which contact or engage. The contemplated materials include Z-type, Y-type, Krytox and Demnum PFPE's. Below is a table of PFPE's which have been successfully deposited as a film on the DMD elements 11,17 of interest and which have ameliorated or eliminated sticking or adhesion therebetween:

| Type of Oil | Molecular Weight (AMU) | Kinematic Viscosity (centistokes) @20° C. | Kinematic Viscosity (centistokes) @100° C. | Vapour Pressure (Torr) @20° C. | Vapour Pressure (Torr) @100° C. | Specific Gravity (g/cc) @29° C. |
|---|---|---|---|---|---|---|
| YH-VAC 140/13 | 6600 | 1508 | | $5 \times 10^{-13}$ | $5 \times 10^{-8}$ | 1.92 |
| YH-VAC 40/11 | 4100 | 474 | | $6 \times 10^{-12}$ | $3 \times 10^{-7}$ | 1.91 |
| YH-VAC 25/9 | 3400 | 285 | 10 | $2 \times 10^{-9}$ | $2 \times 10^{-5}$ | 1.90 |
| YH-VAC 18/8 | 2800 | 190 | 9 | $2 \times 10^{-8}$ | $2 \times 10^{-4}$ | 1.89 |
| YL-VAC 25/6 | 3100–3500 | 276 | 10.5 | $2 \times 10^{-6}$ | $6 \times 10^{-5}$ | 1.90 |
| YL-VAC 16/6 | 2500–2900 | 168 | 9 | $1 \times 10^{-5}$ | $1 \times 10^{-3}$ | 1.89 |
| YL-VAC 14/6 | 2300–2700 | 148 | 7.5 | $2 \times 10^{-6}$ | $4 \times 10^{-4}$ | 1.89 |
| YL-VAC 06/6 | 1600–2000 | 64 | 4 | $2 \times 10^{-6}$ | $3 \times 10^{-3}$ | 1.88 |
| Fomblin SV | 2700–3100 | 200 | | $5 \times 10^{-9}$ | $2 \times 10^{-5}$ | 1.90 |
| Y06 | 1800 | 60 | 3.9 | $3 \times 10^{-5}$ | $3 \times 10^{-3}$ | 1.88 |
| Y04 | 1500 | 38 | 3.2 | $2 \times 10^{-4}$ | | 1.87 |
| Z-DOL | 1900–2300 | 70–100 | | $5 \times 10^{-7}$ | $5 \times 10^{-5}$ | 1.75–1.85 |
| Z-DIAC | | | | $5 \times 10^{-4}$ | | |
| Z-DEAL | 2000 | 20 | | $1.1 \times 10^{-4}$ | $1.1 \times 10^{-3}$ | 1.78 |
| AM2001 | 2300 | 80 | | $2 \times 10^{-6}$ | $2 \times 10^{-4}$ | 1.72 |
| Z60 | 13000 | 600 | 98 | | | 1.85 |
| Z25 | 9300–9700 | 255 | 47 | $2.9 \times 10^{-12}$ | $1 \times 10^{-8}$ | 1.85 |
| Z15 | 8000 | 150 | 25 | $1.6 \times 10^{-6}$ | $1.7 \times 10^{-5}$ | 1.84 |
| Z03 | 4000 | 30 | 5 | $6.6 \times 10^{-5}$ | | 1.82 |
| Krytox 1525 | 4600 | 261 | 11 | $1 \times 10^{-7}$ | $1 \times 10^{-5}$ | 1.90 |
| Krytox 1514 | 3500 | 142 | 7.2 | $2 \times 10^{-7}$ | $1 \times 10^{-4}$ | 1.89 |
| Krytox 1506 | 2400 | 62 | 4.4 | $4 \times 10^{-7}$ | $1 \times 10^{-3}$ | 1.88 |
| Krytox 1618 | 4300 | 175 | 8 | $5 \times 10^{-9}$ | $2 \times 10^{-3}$ | 1.89 |
| Demmum S-200 | 8400 | 500 | 95 (60°) | $5 \times 10^{-10}$ | $1 \times 10^{-7}$ | 1.894 |
| Demmum S-100 | 5600 | 250 | 50 (60°) | $1 \times 10^{-8}$ | $7 \times 10^{-4}$ | 1.878 |
| Demmum S-65 | 4500 | 150 | 33 (60°) | $1 \times 10^{-7}$ | $9 \times 10^{-3}$ | 1.873 |
| Demmum S-20 | 2700 | 53 | 14 (60°) | $2 \times 10^{-6}$ | $4 \times 10^{-3}$ | 1.860 |

Figure 3:
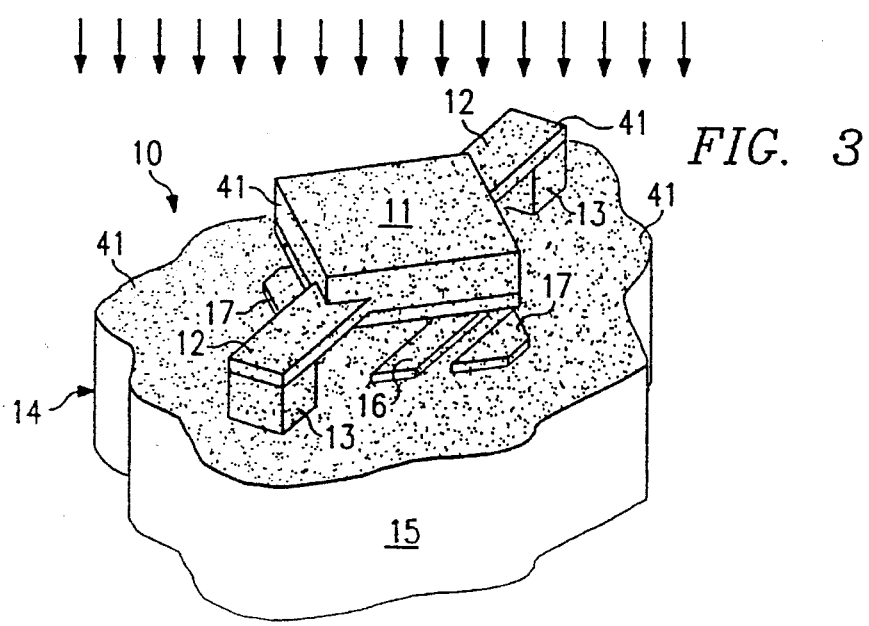
FIG. 3 illustrates an improved micro-mechanical device, according to the present invention, of the type shown in FIGS. 1 and 2 and a process of producing same, wherein a PFPE film is deposited on the engaging portion of the mirror and/or the landing electrode to ameliorate or eliminate sticking or adhesion thereof.

FIG. 3 illustrates a process of applying a PFPE film 31 in accordance with the invention. For purposes of example, a DMD 10 is illustrated, but the process of the invention may be used to advantage with respect to any micro-mechanical device having relatively movable elements which contact or engage and which thereafter experience sticking or adhesion. In the case of fabricating DMD's 10, the process may be performed on an individual DMD 10, simultaneously on an array of DMD's 10, or on a wafer on which have been formed numerous DMD arrays, the wafer being eventually separated into chips, each having one array of DMD's 10. The process of FIG. 3, which permits application of the PFPE simultaneously to large numbers of DMD's 10 is especially suited for volume production and is easily integrated into the process flow for making DMD's or other micro-mechanical devices.

In FIG. 3, the DMD's 10 have been fabricated and include the landing electrodes 17, the address electrodes 16, the mirrors 11, the beams 12 and the supports 13. PFPE may be deposited as a vapor by vapor deposition at low pressure or by thermal evaporative techniques, as a fine mist or an aerosol or other sol produced by an appropriate mechanism such as a nebulizer or atomizer, or as a liquid film resulting from dipping or spinning Deposition of the PFPE results in a PFPE film 31 on all exposed surfaces of the DMD 10, including the portions of the mirrors 11 and the landing electrodes 17 which contact or engage during operation of the DMD 10. The advantages of the present invention may be realized if the PFPE film 31 is deposited on only one of the potentially adherent element portions, though practically speaking such selective deposition may be difficult to achieve.

The thickness of the PFPE film 31 deposited as an aerosol or vapor is a function of the time during which the DMD 10 is exposed thereto, as well as a function of molecular weight, viscosity, vapor pressure and reactivity of the particular PFPE selected. Monolayer films may be obtained on time scales ranging from seconds to minutes. When the PFPE film 31 is deposited by dipping the DMD 10 into PFPE, the PFPE may be dissolved or dispersed in a low surface energy solvent or carrier to obviate damage to the delicate DMD elements which might otherwise be caused by large drops or masses of dense PFPE moving relatively thereto.

While it is preferred that both contacting or engaging portions of the otherwise sticking or adhering elements receive the PFPE film, the anti-sticking and—adhesion benefits of the present invention are realized if only one of these portions bear the film 31.

The PFPE film 31 is deposited to a thickness which permits the migration properties of the PFPE film 31 to effect "self-healing" thereof without rendering the film 31 so thick as to result in increased sticking or adhesion relative to that which occurs without the film 31. Since PFPE is a liquid, oil-like substance—having properties intermediate those of solids and liquids—when the surfaces on which it deposited contact or engage, some of the PFPE at the point or line of contact is "pushed out" therefrom. Upon disengagement of the contacting portions, the PFPE self-heals, that is, it moves back onto the surfaces from which it was pushed out. If the film 31 is not sufficiently thick, it may not self-heal in this manner.

The film 31 should be sufficiently thick to ensure its chemical stability. Specifically, it has been found the if the relatively movable elements of a micro-mechanical device, such as the mirror 11 and the landing electrode 17, are made of typical materials, such as aluminum having an oxidized surface, and if typical procedures, such as plasma etching in an oxygen+$NF_3$ atmosphere, have been previously utilized, PFPE on such surfaces may become decomposed or degraded by breaking down or becoming unstable. It has further been found, however, that if the film 31 is sufficiently thick, the non-stick, non-adhesion effects of the film 31 are not compromised. The latter may, in some cases, be due to the ability of the PFPE, which is deposited as a film after (and on top of) an initial monolayer film thereof to remain stable when it is in contact with the now degraded or decomposed initial monolayer (i.e., decomposed by the aluminum oxide surface and/or by residual compositions resulting from prior processing steps), the degraded or decomposed PFPE, in effect, passivating the surface.

Giving consideration to all of the foregoing, as well as to the topography and roughness of the surfaces receiving the PFPE film 31, a suitable thickness of the PFPE film 31 has been found to be in the range of approximately 5 angstroms to approximately 100 angstroms. A particular PFPE may be selected for a particular micro-mechanical device by giving due consideration to factors such as inter-facial stability, chemical stability, and thermal stability. In general, selection of the PFPE is a function of the material of the surface to which film 31 is applied, the history of this surface as determined by the integrated circuit processing steps previously effected, and the environment in which the micro-mechanical device will operate. For inter-facial stability, a PFPE is chosen that is not completely degraded over time due to reaction with the underlying material.

In the case of DMD's 10 having aluminum mirrors 11 and landing electrodes 17 with aluminum oxide skins or surfaces, suitable PFPE's include acetal-deficient PFPE's, including Y-type PFPE's, and acetal-free Krytox or Demnum, and mixtures of acetal-free and acetal-deficient PFPE's. Z 25-type PFPE, an acetal-rich PFPE, has also been found to be effective for use with DMD's. Acetal-rich PFPE films 31 may exhibit some of the previously discussed decomposition of the initially deposited monolayer film thereof resulting in a passivated surface, so that subsequent layers of the film 31 are stable and achieve the benefits of this invention. Indeed, an initial monolayer film of an acetal-rich PFPE may first be deposited, followed by deposition of subsequent film layers of another PFPE to produce the film 31.

Chemical stability of the film 31 may be encouraged by incorporating selected chemical functional groups in the PFPE material to be deposited, so that PFPE film 31 will bond to the surfaces to which it is applied. These functional groups include hydroxyl, ether, phenolic, and carboxylic groups, among others. For example, where the surface to which PFPE film 31 is applied is aluminum oxide, a carboxylic group is suitable because it can chemically bond with the surface.

As noted, the film 31 and its method of deposit may be utilized to treat micro-mechanical devices other than DMD's. An advantage of the invention is that the film 31 may be thicker than other layer lubricants and thus its application need not be as precisely controlled. Moreover, in addition to obviating sticking or adhesion, the use of the PFPE's lubricates, and prevents contact whereof, the contacting or engaging elements of micro-mechanical devices containing films thereof.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the scope of the invention.

What is claimed is:

1. An improved micro-mechanical device of the type having a first element selectively movable relative to a second element, portions of the elements contacting in one position of the first element, wherein the improvement comprises:

a film of perfluoropolyether (PFPE) on at least one of the contacting portions of the elements.

2. An improved micro-mechanical device as in claim 1, wherein:

the film is effective to overcome the tendency of the contacting portions to resist separating when the elements are moved relatively apart.

3. An improved micro-mechanical device as in claim 1, wherein:

the perfluoropolyether (PFPE) is Z-type, Y-type, Krytox or Demnum.

4. An improved micro-mechanical device as in claim 1 wherein:

the film is about 5 angstroms to about 100 angstroms thick.

5. An improved micro-mechanical device as set forth in claim 1, wherein:

the perfluoropolyether (PFPE) is acetal-deficient.

6. An improved micro-mechanical device as in claim 1, wherein:

the perfluoropolyether (PFPE) is acetal-free.

7. An improved micro-mechanical device as in claim 1, wherein:

the perfluoropolyether (PFPE) is acetal-rich.

8. An improved micro-mechanical device as in claim 7, which further includes:

an additional film of perfluoropolyether (PFPE) on the acetal-rich perfluoropolyether (PFPE) film.

9. An improved micro-mechanical device as in claim 8, wherein:

the additional film is acetal-rich perfluoropolyether (PFPE).

10. An improved micro-mechanical device as in claim 1, wherein:

the film is acetal-deficient, acetal-free or acetal-rich perfluoropolyether (PFPE), or a mixture of two or more thereof.

11. An improved micro-mechanical device as in claim 1, wherein:

the perfluoropolyether (PFPE) has incorporated thereinto as chemical functional groups carboxylic, hydroxyl, ether or phenolic groups.

12. An improved micro-mechanical device as in claim 1, wherein:

the surface of at least one of the contacting portions includes aluminum oxide.

13. An improved micro-mechanical device as in claim 1, wherein:

the perfluoropolyether (PFPE) film is deposited by vapor deposition, thermal evaporation, nebulization, dipping or spinning.

14. A method of treating a micro-mechanical device of the type having a first element selectively movable relative to a second element, portions of the elements contacting in one position of the first element, the treatment being effective to overcome the tendency of the contacting portions to resist separating when the elements are moved apart, wherein the method comprises:

depositing a film of perfluoropolyether (PFPE) on at least one of the contacting portions of the elements.

15. A method as in claim 13, wherein:

the perfluoropolyether (PFPE) is Z-type, Y-type, Krytox or Demnum.

16. A method as in claim 13, wherein:

the film is about 5 angstroms to about 100 angstroms thick.

17. A method as set forth in claim 13, wherein:

the perfluoropolyether (PFPE) is acetal-deficient.

18. A method as in claim 13, wherein:

the perfluoropolyether (PFPE) is acetal-free.

19. A method as in claim 13, wherein:

the perfluoropolyether (PFPE) is acetal-rich.

20. A method as in claim 19, which further includes:

depositing an additional film of perfluoropolyether (PFPE) on the acetal-rich perfluoropolyether (PFPE) film.

21. A method as in claim 20, wherein:

the additional film is acetal-rich.

22. A method as in claim 13, wherein:

the film is acetal-deficient, acetal-free or acetal-rich perfluoropolyether (PFPE) or a mixture of two or more thereof.

23. A method as in claim 13, wherein:

the perfluoropolyether (PFPE) has incorporated thereinto as functional chemical groups carboxylic, hydroxyl, ether or phenolic groups.

24. A method as in claim 13, wherein:

the surface of at least one of the contacting portions includes aluminum oxide.

25. A method as in claim 13, wherein:

the perfluoropolyether (PFPE) film is deposited by vapor deposition, thermal evaporation, nebulization, dipping, or spinning.

26. An improved micro-mechanical device made by the method of claim 13.

27. An improved micro-mechanical device as in claim 26, wherein:

the device is a Digital MicroMirror Device (DMD), one of the elements is a movable mass mounted on a deformable beam, and the other element is a stop which limits movement of the mass.

* * * * *